United States Patent
Yagi et al.

(10) Patent No.: US 11,478,893 B2
(45) Date of Patent: Oct. 25, 2022

(54) POLISHING METHOD AND POLISHING APPARATUS

(71) Applicant: EBARA CORPORATION, Tokyo (JP)

(72) Inventors: Keita Yagi, Tokyo (JP); Toshimitsu Sasaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1006 days.

(21) Appl. No.: 16/179,504

(22) Filed: Nov. 2, 2018

(65) Prior Publication Data

US 2019/0134774 A1    May 9, 2019

(30) Foreign Application Priority Data

Nov. 6, 2017  (JP) .............................. JP2017-213658

(51) Int. Cl.
*B24B 37/005*  (2012.01)
*B24B 37/20*  (2012.01)
(Continued)

(52) U.S. Cl.
CPC .......... *B24B 37/005* (2013.01); *B24B 37/013* (2013.01); *B24B 37/20* (2013.01);
(Continued)

(58) Field of Classification Search
CPC ..... B24B 37/005; B24B 37/013; B24B 37/20; B24B 37/32; B24B 37/34; B24B 49/105;
(Continued)

(56) References Cited

U.S. PATENT DOCUMENTS 6,190,234 B1 *  2/2001  Swedek ................ B24B 37/013
                                                   451/6
8,535,115 B2 *  9/2013  David ..................... B24B 49/12
                                                   451/6
(Continued)

FOREIGN PATENT DOCUMENTS

CN    102729137 A    10/2012
CN    105428229 A     3/2016
(Continued)

OTHER PUBLICATIONS

Singapore Patent Application No. 10201809732W; Written Opinion and Search Report; dated Jun. 15, 2021; 7 pages.

*Primary Examiner* — Joseph J Hail
*Assistant Examiner* — Arman Milanian
(74) *Attorney, Agent, or Firm* — BakerHostetler

(57) ABSTRACT

A polishing method capable of improving a spatial resolution of a film-thickness measurement without changing a measuring cycle of a film-thickness sensor and without increasing an amount of measurement data is disclosed. The polishing method includes: rotating a first film-thickness sensor and a second film-thickness sensor together with a polishing table, the first film-thickness sensor and the second film-thickness sensor being located at the same distance from a center of the polishing table; causing the first film-thickness sensor and the second film-thickness sensor to generate signal values indicating film thicknesses at measurement points on a surface of a substrate, while a polishing head is pressing the substrate against a polishing pad on the rotating polishing table, the measurement points being located at different distances from a center of the substrate; and controlling polishing pressure applied from the polishing head to the substrate based on the signal values (Continued)

generated by the first film-thickness sensor and the second film-thickness sensor.

15 Claims, 7 Drawing Sheets

(51) Int. Cl.
    *B24B 37/34*     (2012.01)
    *B24B 49/10*     (2006.01)
    *B24B 49/12*     (2006.01)
    *H01L 21/66*     (2006.01)
    *H01L 21/67*     (2006.01)
    *B24B 37/013*     (2012.01)
    *B24B 37/32*     (2012.01)

(52) U.S. Cl.
    CPC .............. *B24B 37/32* (2013.01); *B24B 37/34* (2013.01); *B24B 49/105* (2013.01); *B24B 49/12* (2013.01); *H01L 21/67092* (2013.01); *H01L 22/12* (2013.01); *H01L 22/26* (2013.01)

(58) Field of Classification Search
    CPC ....... B24B 49/12; B24B 49/04; B24B 37/042; B24B 37/10; B24B 37/105; B24B 37/205; B24B 37/30; B24B 49/10; H01L 21/304; H01L 21/67092; H01L 21/67259; H01L 21/68764; H01L 22/12; H01L 22/26; H01L 21/67253; B24D 7/12
    USPC .................................................... 451/288, 6
    See application file for complete search history.

(56) References Cited

U.S. PATENT DOCUMENTS

| | | | |
|---|---|---|---|
| 2002/0098777 | A1 | 7/2002 | Laursen et al. |
| 2005/0042975 | A1* | 2/2005 | David .................. B24B 49/105 451/5 |
| 2005/0173259 | A1* | 8/2005 | Mavliev .................. B23H 5/08 451/526 |
| 2009/0286332 | A1 | 11/2009 | Ohta et al. |
| 2010/0112901 | A1 | 5/2010 | Togawa et al. |
| 2014/0011429 | A1 | 1/2014 | David et al. |
| 2017/0133252 | A1* | 5/2017 | Fung ....................... H01L 22/20 |

FOREIGN PATENT DOCUMENTS

| | | |
|---|---|---|
| CN | 205166654 U | 4/2016 |
| CN | 206084732 U | 4/2017 |
| JP | 2001-009699 A | 1/2001 |
| JP | 2007-243221 A | 9/2007 |
| JP | 2007-331108 A | 12/2007 |
| JP | 2011-009679 A | 1/2011 |
| JP | 2011-082286 A | 4/2011 |
| JP | 2012-138442 A | 7/2012 |

\* cited by examiner

POLISHING METHOD AND POLISHING APPARATUS

CROSS REFERENCE TO RELATED APPLICATION

This document claims priority to Japanese Patent Application Number 2017-213658 filed Nov. 6, 2017, the entire contents of which are hereby incorporated by reference.

BACKGROUND

These days, semiconductor devices have become increasingly finer and their interconnect widths have now reached a level of less than 10 nm, which requires strict nanometer-level control of a thickness of a film of a wafer. In a general polishing end point detection system, a film thickness of a wafer is measured with one film-thickness sensor installed in a polishing table, and a polishing end point is detected based on a measured value of the film thickness. However, the resolution of the polishing end point detection corresponds to an amount of polishing per one rotation of the polishing table, which is not sufficient to precisely detect the polishing end point.

Therefore, as disclosed in Japanese laid-open patent publication No. 2012-138442, there is a technique for improving the resolution of polishing end point detection per rotation of the polishing table by using multiple film-thickness sensors installed in the polishing table. According to this technique, not only the precision of the polishing end point, but also the film-thickness control precision during polishing of a wafer can be improved. That is, a film-thickness uniformity over a wafer surface can be improved by obtaining a film-thickness distribution over the entire surface of the wafer including a central portion and an edge portion of the wafer during polishing of the wafer, and controlling polishing pressure on the wafer based on the film-thickness distribution obtained.

Recently, there is a demand for more precisely controlling a film-thickness profile during polishing of a wafer. In particular, the film thickness at the edge portion of the wafer changes relatively largely according to a radial distance from the wafer center. Thus, it is required to control polishing pressure on a finer region in the edge portion. In order to respond to such a demand, it is important to precisely measure the film-thickness distribution with an improved spatial resolution of film-thickness measurement. One solution for improving the spatial resolution of the film-thickness measurement is to shorten a measuring cycle of a film-thickness sensor. However, shortening the measuring cycle of the film-thickness sensor entails an increase in an amount of measurement data per one revolution of the polishing table, thus resulting in an increase in an amount of data communication and an increase in calculation load.

SUMMARY OF THE INVENTION

According to embodiments, there are provided a polishing method and a polishing apparatus capable of improving a spatial resolution of a film-thickness measurement without changing a measuring cycle of a film-thickness sensor and without increasing an amount of measurement data.

Embodiments, which will be described below, relate to a method and apparatus for polishing a substrate such as a wafer, and more particularly to a method and apparatus for obtaining a film-thickness distribution on a substrate surface, including a central area and an edge area, during polishing of the substrate, controlling polishing pressure applied to the substrate based on the obtained film-thickness distribution and/or detecting a polishing end point.

In an embodiment, there is provided a polishing method comprising: rotating a first film-thickness sensor and a second film-thickness sensor together with a polishing table, the first film-thickness sensor and the second film-thickness sensor being located at the same distance from a center of the polishing table; causing the first film-thickness sensor and the second film-thickness sensor to generate signal values indicating film thicknesses at measurement points on a surface of a substrate, while a polishing head is pressing the substrate against a polishing pad on the rotating polishing table, the measurement points being located at different distances from a center of the substrate; and controlling polishing pressure applied from the polishing head to the substrate based on the signal values generated by the first film-thickness sensor and the second film-thickness sensor.

In an embodiment, the polishing method further comprises: obtaining a signal value generated by the first film-thickness sensor at a first point in time in an N-th rotation of the polishing table; obtaining a latest signal value generated by the second film-thickness sensor during the N-th rotation of the polishing table, and a previous signal value generated by the second film-thickness sensor during an N−1-th rotation of the polishing table; and calculating an interpolated signal value from the latest signal value and the previous signal value, the interpolated signal value corresponding to a signal value of the second film-thickness sensor at the first point in time, wherein controlling the polishing pressure applied from the polishing head to the substrate based on the signal values generated by the first film-thickness sensor and the second film-thickness sensor comprises controlling polishing pressure applied from the polishing head to the substrate based on the signal value generated by the first film-thickness sensor at the first point in time and the interpolated signal value.

In an embodiment, the interpolated signal value is a weighted average of the latest signal value and the previous signal value.

In an embodiment, the interpolated signal value is given by $WA = S2a \times ((360-\theta)/360) + S2b \times (\theta/360)$, where $\theta$ represents an angle between two lines extending from the center of the polishing table to the first film-thickness sensor and the second film-thickness sensor, $S2a$ represents the latest signal value, $S2b$ represents the previous signal value, and $WA$ represents the interpolated signal value.

In an embodiment, the polishing method further comprises producing a film-thickness profile using the signal value generated by the first film-thickness sensor and the interpolated signal value.

In an embodiment, the polishing method further comprises determining a polishing end point of the substrate based on the signal value generated by the first film-thickness sensor and the interpolated signal value.

In an embodiment, determining the polishing end point comprises terminating polishing of the substrate when one of the signal value generated by the first film-thickness sensor and the interpolated signal value reaches a target value.

In an embodiment, determining the polishing end point comprises terminating polishing of the substrate when one of a film thickness value, converted from the signal value of the first film-thickness sensor, and a film thickness value, converted from the interpolated signal value, reaches a target value.

In an embodiment, there is provided a polishing apparatus comprising: a polishing table for supporting a polishing pad;

a polishing head configured to press a substrate against the polishing pad to polish the substrate; a first film-thickness sensor and a second film-thickness sensor arranged in the polishing table and located at the same distance from a center of the polishing table; a sensor controller configured to transmit trigger signals to the first film-thickness sensor and the second film-thickness sensor to cause the first film-thickness sensor and the second film-thickness sensor to generate signal values indicating film thicknesses at measurement points on a surface of the substrate, the measurement points being located at different distances from a center of the substrate; and a data processor configured to receive the signal values from the first film-thickness sensor and the second film-thickness sensor and determine a target value of polishing pressure applied from the polishing head to the substrate.

In an embodiment, the polishing apparatus further comprises: a table rotational position detector configured to detect a rotational position of the polishing table, Wherein the sensor controller is configured to determine timings for transmitting the trigger signals to the first film-thickness sensor and the second film-thickness sensor based on a signal indicating the rotational position of the polishing table and a rotational speed of the polishing table, and to transmit the trigger signals to the first film-thickness sensor and the second film-thickness sensor with the determined timings to cause the first film-thickness sensor and the second film-thickness sensor to generate the signal values indicating film thicknesses at the measurement points on the surface of the substrate.

In an embodiment, the polishing apparatus further comprises an operation controller configured to control the polishing pressure applied from the polishing head to the substrate based on the target value of the polishing pressure.

In an embodiment, the data processor is configured to: obtain a signal value generated by the first film-thickness sensor at a first point in time in an N-th rotation of the polishing table; obtain a latest signal value generated by the second film-thickness sensor during the N-th rotation of the polishing table, and a previous signal value generated by the second film-thickness sensor during an N−1-th rotation of the polishing table; calculate an interpolated signal value from the latest signal value and the previous signal value, the interpolated signal value corresponding to a signal value of the second film-thickness sensor at the first point in time; and determine the target value of the polishing pressure applied from the polishing head to the substrate based on the signal value generated by the first film-thickness sensor at the first point in time and the interpolated signal value.

In an embodiment, the data processor stores therein in advance a formula expressed as WA=S2$a$×((360−θ)/360)+ S2$b$×(θ/360), where θ represents an angle between two lines extending from the center of the polishing table to the first film-thickness sensor and the second film-thickness sensor, S2$a$ represents the latest signal value, S2$b$ represents the previous signal value, and WA represents the interpolated signal value.

In an embodiment, the data processor is configured to produce a film-thickness profile using the signal value generated by the first film-thickness sensor and the interpolated signal value.

In an embodiment, the data processor is configured to determine a polishing end point of the substrate based on the signal value generated by the first film-thickness sensor and the interpolated signal value.

According to the above-described embodiments, the distances from the center of the substrate to the measurement points of the first film-thickness sensor are different from the distances from the center of the substrate to the measurement points of the second film-thickness sensor. Therefore, the spatial resolution of the film thickness measurement can be improved without changing a film-thickness measurement cycle and without increasing the number of signal values obtained per one rotation of the polishing table. Moreover, according to the above-described embodiments, the interpolated signal value of the second film-thickness sensor is calculated from the latest signal value obtained at the N-th rotation of the polishing table and the previous signal value obtained at the N−1-th rotation of the polishing table. This interpolated signal value corresponds to a signal value of the second film-thickness sensor generated at the same point in time as the signal value of the first film-thickness sensor. Therefore, an accurate and precise film thickness profile can be created using the signal value of the first film-thickness sensor and the interpolated signal value. As a result, appropriate polishing pressure can be applied to the substrate based on the film-thickness profile, and the polishing end point can be accurately determined based on the film-thickness profile.

DESCRIPTION OF EMBODIMENTS

Embodiments will now be described with reference to the drawings.

Figure 1:
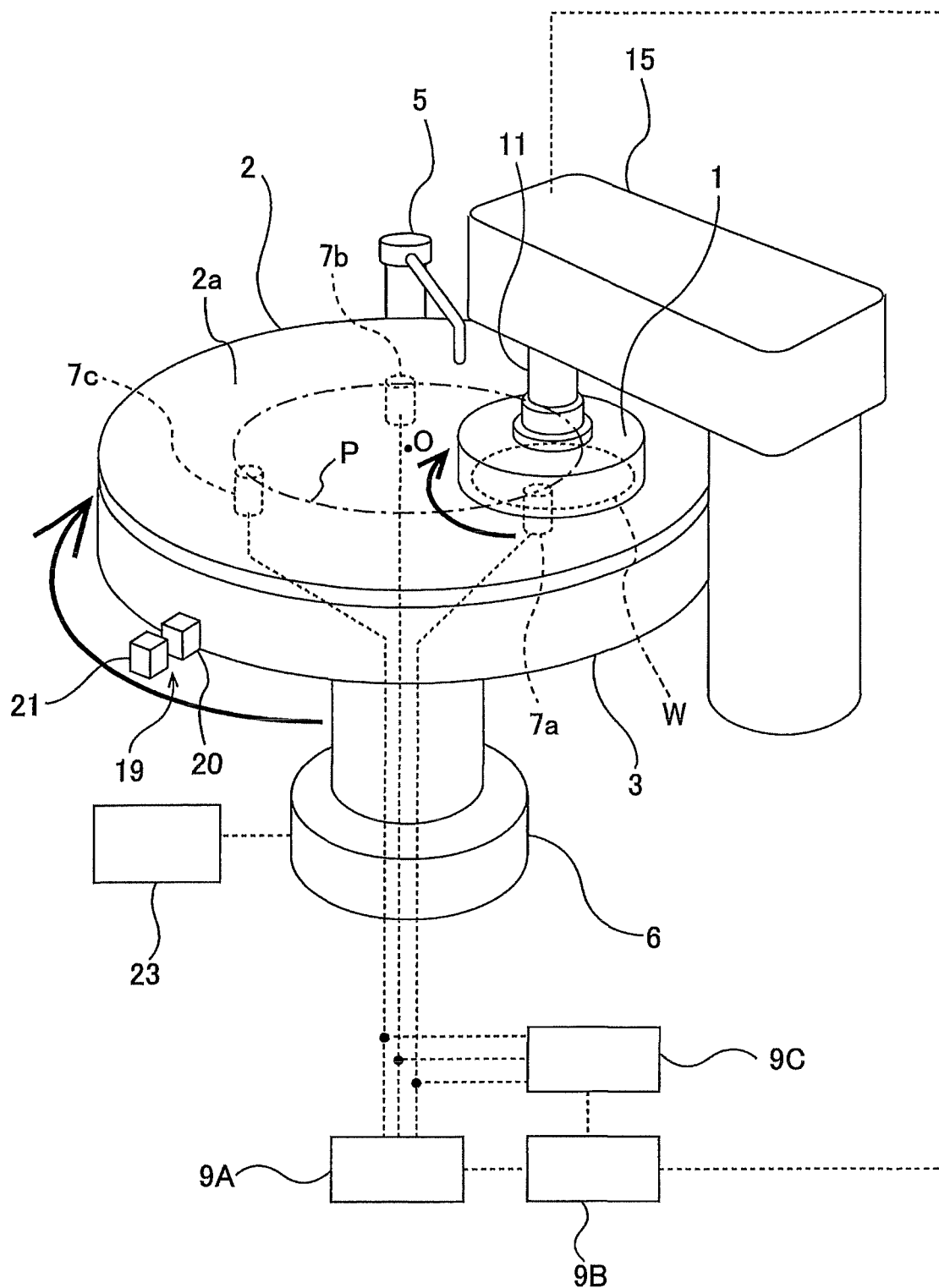
FIG. 1 is a schematic view showing an embodiment of a polishing apparatus.

FIG. 1 is a schematic view showing an embodiment of a polishing apparatus. As shown FIG. 1, the polishing apparatus includes a polishing table 3 that supports a polishing pad 2, a polishing head 1 for pressing a wafer W, which is an example of a substrate, against the polishing pad 2, a table motor 6 for rotating the polishing table 3, and a polishing-liquid supply nozzle 5 for supplying a polishing liquid (slurry) onto the polishing pad 2. The surface of the polishing pad 2 constitutes a polishing surface 2$a$ for polishing the wafer W. The polishing table 3 is coupled to the table motor 6, which rotates the polishing table 3 and the polishing pad 2 together. The polishing head 1 is secured to an end of a polishing head shaft 11, which is rotatably supported by a head arm 15.

The wafer W is polished in the following manner. While the polishing table 3 and the polishing head 1 are rotating in directions indicated by arrows in FIG. 1, the polishing liquid is supplied from the polishing-liquid supply nozzle 5 onto the polishing surface 2a of the polishing pad 2 on the polishing table 3. While the wafer W is being rotated by the polishing head 1, the wafer W is pressed against the polishing surface 2a of the polishing pad 2 in the presence of the polishing liquid between the polishing pad 2 and the wafer W. The surface of the wafer W is polishing by the chemical action of the polishing liquid and by the mechanical action of abrasive particles contained in the polishing liquid.

Three film-thickness sensors 7a, 7b, 7c are arranged in the polishing table 3. The film-thickness sensors 7a, 7b, 7c are sensors each configured to generate a signal value indicating a film thickness at a predetermined measurement point on a surface of the wafer W. The film-thickness sensors 7a, 7b, 7c rotate together with the polishing table 3 and the polishing pad 2. The film-thickness sensors 7a, 7b, 7c are each located in such a position as to traverse a surface (i.e., a lower surface to be polished) of the wafer W on the polishing pad 2 each time the polishing table 3 and the polishing pad 2 make one rotation. The film-thickness sensors 7a, 7b, 7c generate signal values while the film-thickness sensors 7a, 7b, 7c sweep across the surface of the wafer W. The film-thickness sensors 7a, 7b, 7c are coupled to a data processor 9A. The signal values outputted by the film-thickness sensors 7a, 7b, 7c are sent to the data processor 9A.

Figure 2:
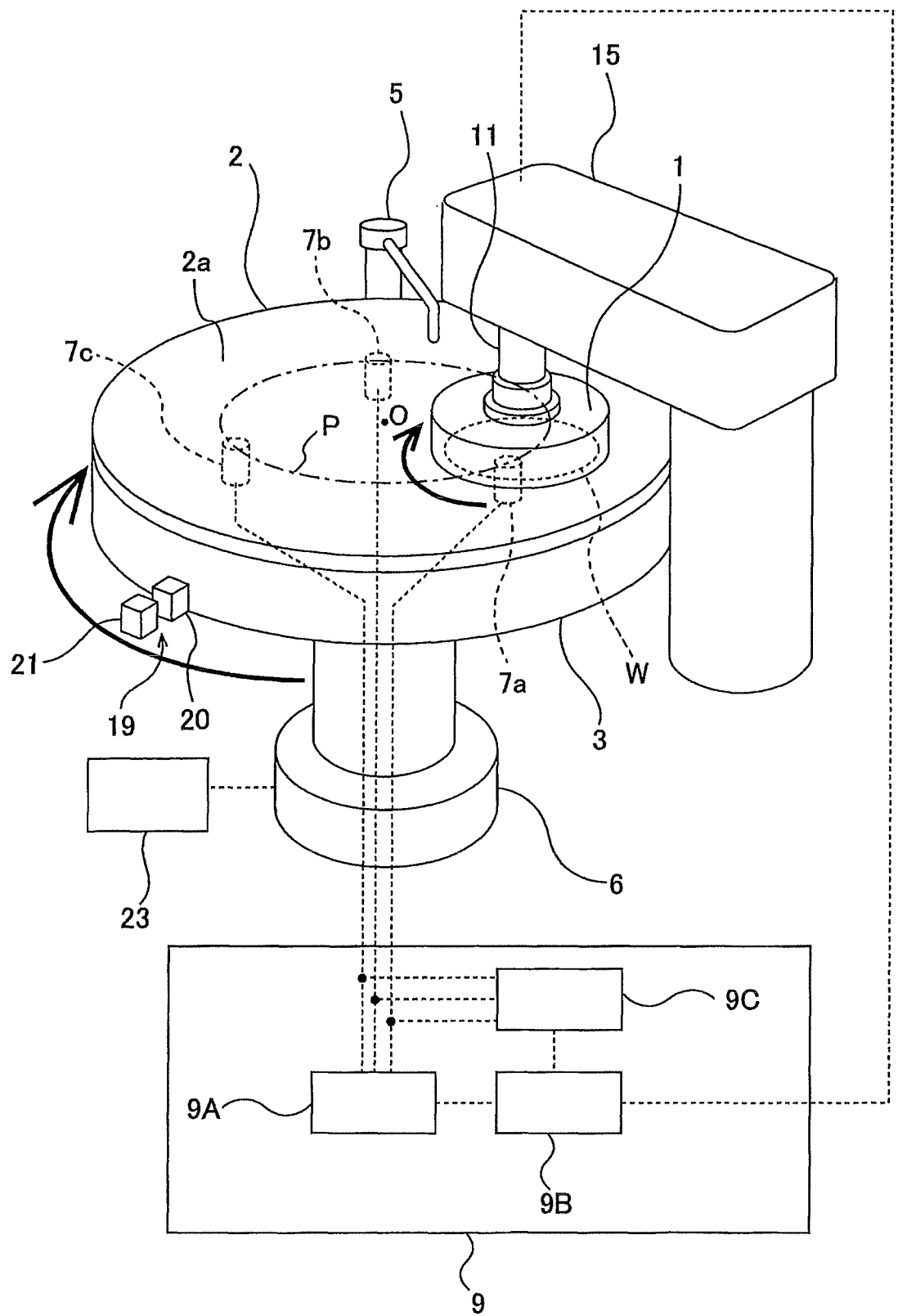
FIG. 2 is a schematic view showing an embodiment in which a data processor, an operation controller, and a sensor controller shown in FIG. 1 are constituted by one computer.

The polishing apparatus also includes an operation controller 9B for controlling operations of the polishing head 1, the polishing table 3 and the polishing-liquid supply nozzle 5. Furthermore, the polishing apparatus includes a sensor controller 9C for controlling operations of the film-thickness sensors 7a, 7b, 7c. The film-thickness sensors 7a, 7b, 7c are coupled to the sensor controller 9C. The operation controller 9B is coupled to the data processor 9A, and the sensor controller 9C is coupled to the operation controller 9B. The data processor 9A, the operation controller 9B, and the sensor controller 9C may each be comprised of a dedicated computer or a general-purpose computer. Alternatively, as in an embodiment shown in FIG. 2, a single dedicated or general-purpose computer 9 may include the data processor 9A, the operation controller 9B, and the sensor controller 9C.

The operation controller 9B transmits a measurement starting signal and measurement condition information to the sensor controller 9C. Upon receipt of the measurement starting signal, the sensor controller 9C sends trigger signals to the film-thickness sensors 7a, 7b, 7c each time the polishing table 3 makes one rotation. The film-thickness sensors 7a, 7b, 7c generate the above-described signal values upon receipt of the trigger signals. A transmission cycle of trigger signals to each film-thickness sensor correspond to a measuring cycle contained in the measurement condition information. Thus, the sensor controller 9C generates trigger signals in the measuring cycle contained in the measurement condition information, and sends the trigger signals successively to each film-thickness sensor.

The sensor controller 9C determines timings for transmitting the trigger signals to the film-thickness sensors 7a, 7b, 7c based on a rotational speed of the polishing table 3 and a signal indicating a rotational position of the polishing table 3 sent from a table rotational position detector 19. The sensor controller 9C transmits the trigger signals to the film-thickness sensors 7a, 7b, 7c with the determined timings. More specifically, the sensor controller 9C transmits trigger signals to the film-thickness sensors 7a, 7b, 7c with different timings. Therefore, each time the polishing table 3 makes one rotation, the film-thickness sensors 7a, 7b, 7c generate the signal values with different timings while the film-thickness sensors 7a, 7b, 7c are sweeping across the surface of the wafer W.

The table rotational position detector 19 is comprised of a combination of a sensor target 20 secured to the polishing table 3, and a proximity sensor 21 disposed beside the polishing table 3. The sensor target 20 rotates together with the polishing table 3, whereas the position of the proximity sensor 21 is fixed. Upon sensing the sensor target 20, the proximity sensor 21 transmits a signal indicating the rotational position of the polishing table 3 to the sensor controller 9C. The sensor controller 9C can calculate a current rotational position of the polishing table 3 based on the rotational speed of the polishing table 3 and the signal indicating the rotational position of the polishing table 3. In one embodiment, the table rotational position detector 19 may be comprised of a motor driver 23 for the table motor 6.

In this embodiment, the three film-thickness sensors 7a, 7b, 7c are arranged at equal intervals around a center O of the polishing table 3. Distances from the center O of the polishing table 3 to the film-thickness sensors 7a, 7b, 7c are the same. Accordingly, as the polishing table 3 rotates, the film-thickness sensors 7a, 7b, 7c move across the surface of the wafer W in the same path P. During polishing of the wafer W, the polishing head 1 and the polishing table 3 rotate, while the position of the polishing head 1 relative to the polishing table 3 is fixed, In one embodiment, only two film-thickness sensors may be provided around the center O of the polishing table 3, or four or more film-thickness sensors may be provided around the center O of the polishing table 3. Although it is preferable that the plurality of film-thickness sensors be arranged at equal intervals around the center O of the polishing table 3, these film-thickness sensors may not be arranged at equal intervals.

Figure 3:
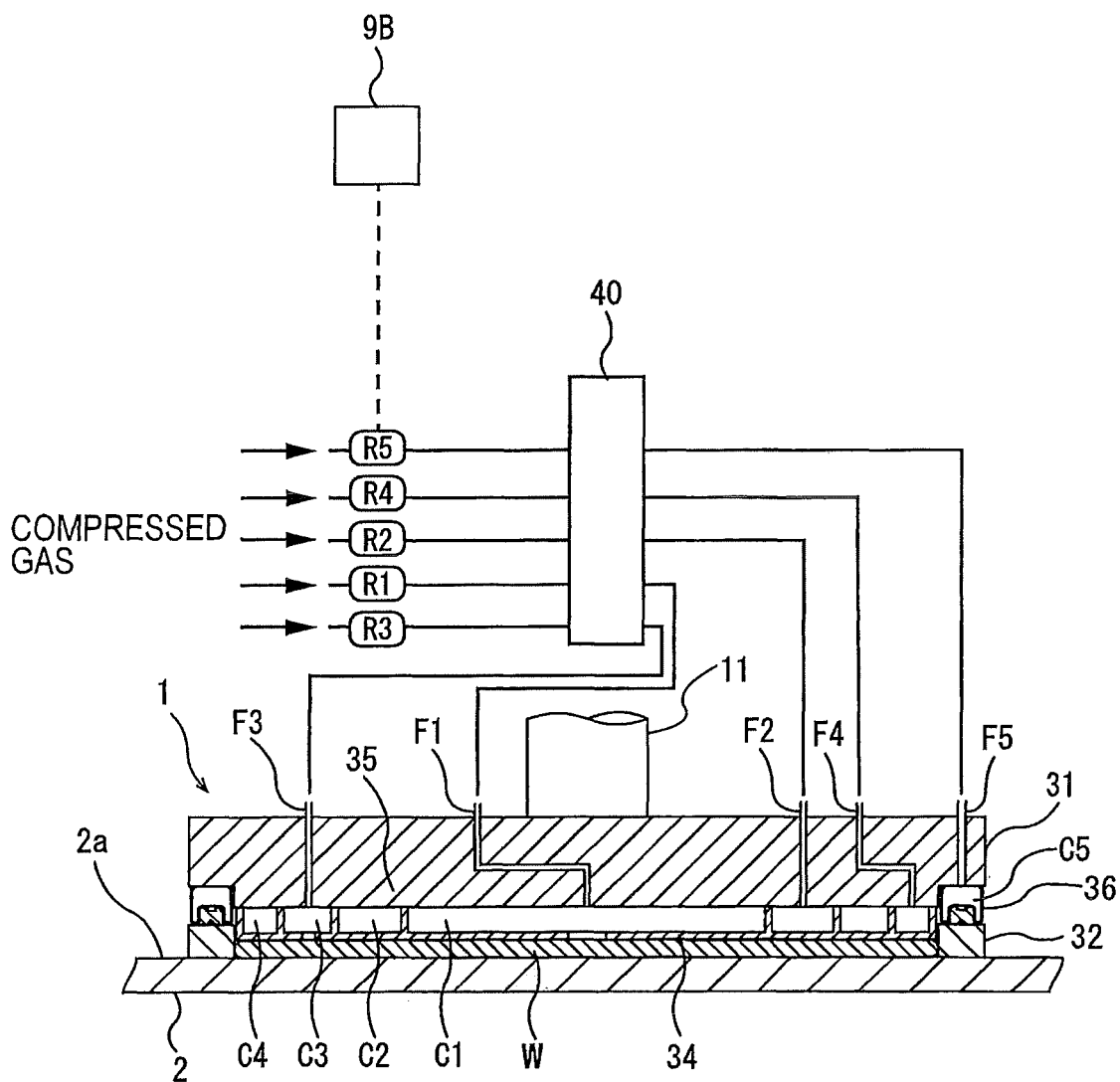
FIG. 3 is a cross-sectional view of a polishing head.

Next, the polishing head 1 will be described below. FIG. 3 is a cross-sectional view showing the polishing head 1. The polishing head 1 includes a head body 31 fixed to the end of the polishing head shaft 11, a membrane (or an elastic membrane) 34 attached to a lower part of the head body 31, and a retainer ring 32 disposed below the head body 31. The retainer ring 32 is arranged around the membrane 34. The retainer ring 32 is an annular structure for retaining the wafer W so as to prevent the wafer W from being ejected from the polishing head 1 during polishing of the wafer W.

Four pressure chambers C1, C2, C3, and C4 are provided between the membrane 34 and the head body 31. The pressure chambers C1, C2, C3, and C4 are formed by the membrane 34 and the head body 31. The central pressure chamber C1 has a circular shape, and the other pressure chambers C2, C3, and C4 have an annular shape. These pressure chambers C1, C2, C3, and C4 are in a concentric arrangement.

Gas delivery lines F1, F2, F3, and F4 are coupled to the pressure chambers C1, C2, C3, and C4, respectively. One end of each of the gas delivery lines F2, F3, and F4 is coupled to a compressed-gas supply source (not shown), which is provided as one of utilities in a factory in which the polishing apparatus is installed. A compressed gas, such as compressed air, is supplied into the pressure chambers C1, C2, C3, and C4 through the gas delivery lines F1, F2, F3, and F4, respectively.

The gas delivery line F3, which communicates with the pressure chamber C3, is coupled to a vacuum line (not shown), so that a vacuum can be formed in the pressure chamber C3. The membrane 34 has an opening in a portion that forms the pressure chamber C3, so that the wafer W can be held by the polishing head 1 via vacuum suction by producing a vacuum in the pressure chamber C3. Further, the wafer W can be released from the polishing head 1 by supplying the compressed gas into the pressure chamber C3.

An annular membrane (or an annular rolling diaphragm) 36 is provided between the head body 31 and the retainer ring 32, and a pressure chamber C5 is formed in this membrane 36. The pressure chamber C5 communicates with the compressed-gas supply source through a gas delivery line F5. The compressed-gas supply source supplies the compressed gas into the pressure chamber C5 through the gas delivery line F5, so that the pressure chamber C5 presses the retainer ring 32 against the polishing pad 23.

The gas delivery lines F1, F2, F3, F4, and F5 extend via a rotary joint 40 attached to the polishing head shaft 11. The gas delivery lines F1, F2, F3, F4, and F5, communicating with the pressure chambers C1, C2, C3, C4, and C5, respectively, are provided with pressure regulators R1, R2, R3, R4, and R5, respectively. The compressed gas from the compressed-gas supply source is supplied through the pressure regulators R1 to R5 into the pressure chambers C1 to C5, respectively and independently. The pressure regulators R1 to R5 are configured to regulate the pressures of the compressed gases in the pressure chambers C1 to C5.

The pressure regulators R1 to R5 can change independently the pressures in the pressure chambers C1 to C5 to thereby independently adjust the polishing pressures against corresponding four areas of the wafer W, i.e., a central portion; an inner intermediate portion; an outer intermediate portion; and an edge portion, and a pressing force of the retainer ring 32 against the polishing pad 2. The gas delivery lines F1, F2, F3, F4 and F5 are coupled to vent valves (not shown), respectively, so that the pressure chambers C1 to C5 can be vented to the atmosphere. The membrane 34 in this embodiment defines the four pressure chambers C1 to C4, while, in one embodiment, the membrane 34 may define less than four pressure chambers or more than four pressure chambers.

The data processor 9A (see FIGS. 1 and 2) receives the signal values, each indicating a film thickness of the wafer W, from the film-thickness sensors 7a, 7b, 7c and, based on the signal values, determines target pressure values of the pressure chambers C1 to C5 for achieving a target film-thickness profile, and transmits the target pressure values to the operation controller 9B. The target pressure values of the pressure chambers C1 to C4 correspond to target values of polishing pressures to be applied from the polishing head 1 to the wafer W. The target pressure value of the pressure chamber C5 corresponds to a target value of the pressing force applied from the retainer ring 32 to the polishing pad 2. The pressure regulators R1 to R5 are coupled to the operation controller 9B. The operation controller 9B sends, as command values, the respective target pressure values of the pressure chambers C1 to C5 to the pressure regulators R1 to R5, which in turn operate to maintain the pressures in the pressure chambers C1 to C5 at the corresponding target pressure values.

The polishing head 1 can apply independent polishing pressures to the plurality of areas of the wafer W. For example, the polishing head 1 can press the different areas of the surface of the wafer W at different polishing pressures against the polishing surface 2a of the polishing pad 2. Therefore, the polishing head 1 can control the film-thickness profile of the wafer W so as to achieve a target film-thickness profile.

The film-thickness sensors 7a, 7b, 7c are sensors each configured to output a signal value which varies according to a film thickness of the wafer W. The signal value is a numerical value or data (numerical group) which directly or indirectly indicates a film thickness. Each of the film-thickness sensors 7a, 7b, 7c is, for example, comprised of an optical film-thickness sensor or an eddy-current sensor. The optical film-thickness sensor is configured to irradiate the surface of the wafer W with light, measure intensities of reflected light from the wafer W at respective wavelengths, and output the intensities of the reflected light in relation to the wavelengths. The intensities of the reflected light in relation to the wavelengths are a signal value which varies according to the film thickness of the wafer W. The eddy-current sensor induces eddy currents in a conductive film formed on the wafer W, and outputs a signal value which varies according to an impedance of an electrical circuit including the conductive film and a coil of the eddy-current sensor. The optical film-thickness sensor and the eddy-current sensor that can be used in this embodiment may be known devices.

Figure 4:
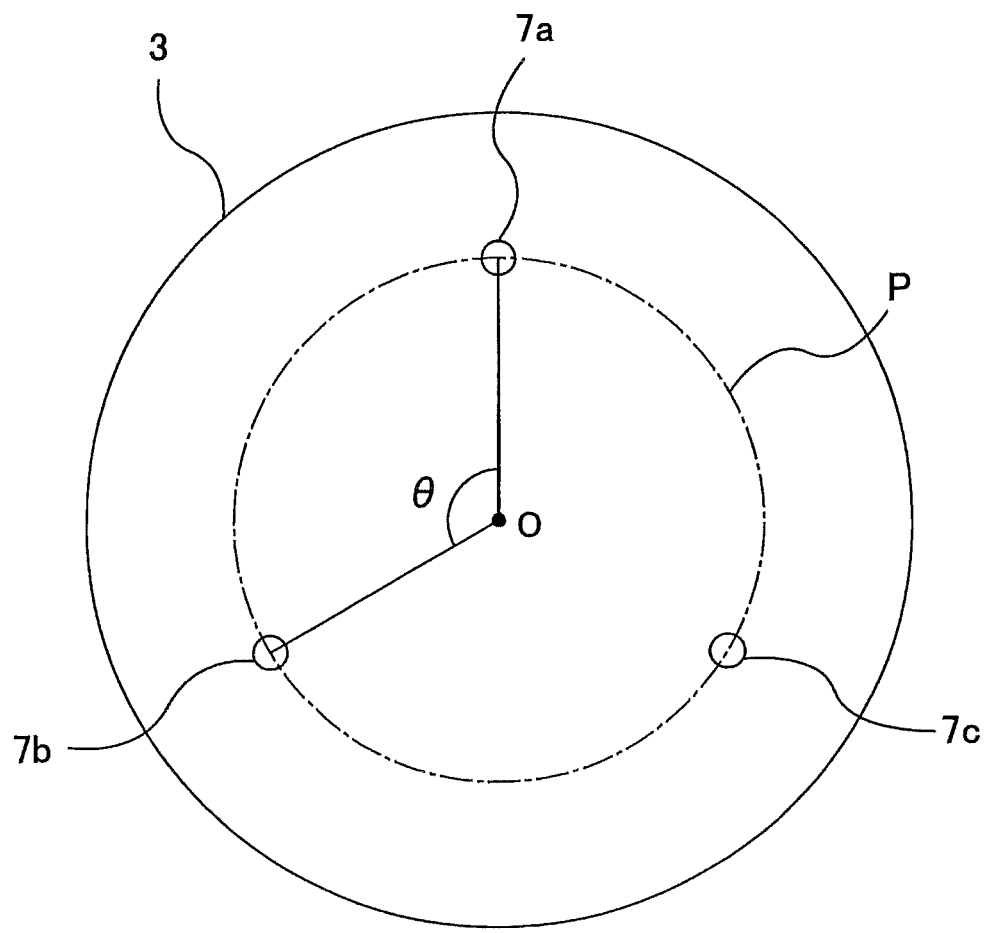
FIG. 4 is a plan view showing an arrangement of a first film-thickness sensor, a second film-thickness sensor, and a third film-thickness sensor disposed in a polishing table.

FIG. 4 is a plan view showing an arrangement of the first film-thickness sensor 7a, the second film-thickness sensor 7b, and the third film-thickness sensor 7c installed in the polishing table 3. In FIG. 4, the illustration of the polishing pad 2 is omitted, A symbol θ represents an angle between a straight line extending from the center O of the polishing table 3 to the first film-thickness sensor 7a and a straight line extending from the center O of the polishing table 3 to the second film-thickness sensor 7b. In the present embodiment, the first film-thickness sensor 7a, the second film-thickness sensor 7b, and the third film-thickness sensor 7c are arranged at equal intervals around the center O of the polishing table 3, and therefore the angle θ is 120 degrees.

As shown in FIG. 4, the first film-thickness sensor 7a, the second film-thickness sensor 7b, and the third film-thickness sensor 7c are located at the same distance from the center O of the polishing table 3, and are located away from each other in the circumferential direction of the polishing table 3. Therefore, when the polishing table 3 is rotating, the first film-thickness sensor 7a, the second film-thickness sensor 7b, and the third film-thickness sensor 7c scan the surface of the wafer W at different timings while moving in the same path P.

Figure 5:
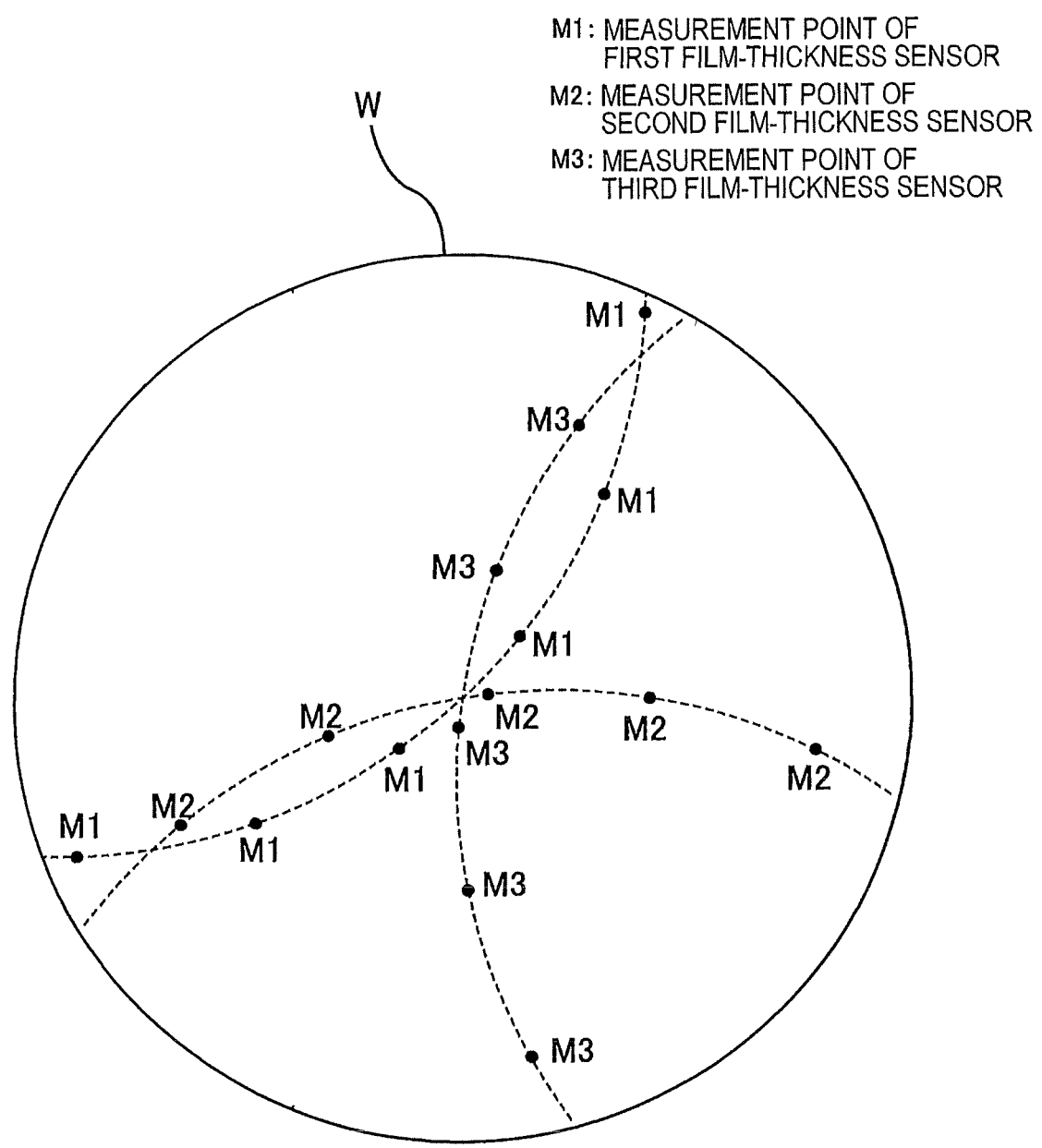
FIG. 5 is a diagram showing trajectories and measurement points of the first film-thickness sensor, the second film-thickness sensor, and the third film-thickness sensor.

FIG. 5 is a view showing measurement points of the first film-thickness sensor 7a, the second film-thickness sensor 7b, and the third film-thickness sensor 7c. The polishing head 1 and the polishing table 3 rotate at different rotational speeds. Therefore, the first film-thickness sensor 7a, the second film-thickness sensor 7b, and the third film-thickness sensor 7c move in different trajectories on the wafer W, and generate the signal values indicating film thicknesses at a plurality of predetermined measurement points M1, M2, M3. Specifically, each time the polishing table 3 makes one revolution, the first film-thickness sensor 7a generates signal values indicating film thicknesses at a plurality of predetermined measurement points M1 on the surface of the wafer W. Similarly, each time the polishing table 3 makes one revolution, the second film-thickness sensor 7b generates signal values indicating film thicknesses at a plurality of predetermined measurement points M2 on the surface of the wafer W, and the third film-thickness sensor 7c generates signal values indicating film thicknesses at a plurality of predetermined measurement points M3 on the surface of the wafer W. The measurement points M1, M2, and M3 are measurement points on the surface of the wafer W at different distances from the center of the wafer W.

Since the relative position of the polishing head 1 with respect to the polishing table 3 is fixed during polishing of the wafer W, each time the polishing table 3 makes one revolution, the first film-thickness sensor 7a, the second film-thickness sensor 7b, and the third film-thickness sensor 7c move across the surface of the wafer W. More specifically, each time the polishing table 3 makes one revolution, the first film-thickness sensor 7a, the second film-thickness sensor 7b, and the third film-thickness sensor 7c generate signal values indicating film thicknesses at the measurement points M1, M2, and M3 located at different distances from the center of the wafer W, while moving across the surface of the wafer W. The data processor 9A receives the signal values from the film-thickness sensors 7a, 7b, 7c, and processes these signal values.

Figure 6:
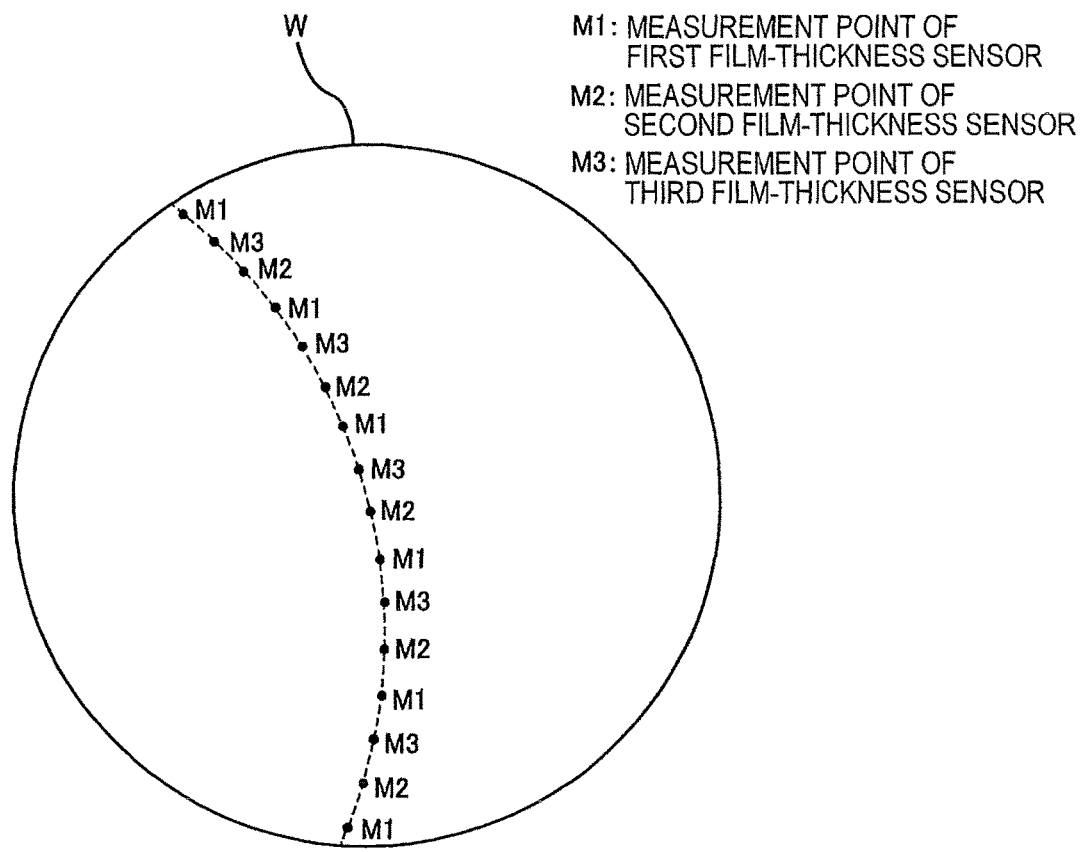
FIG. 6 is a diagram in which three trajectories shown in FIG. 5 are superimposed to form one trajectory, and measurement points of the first film-thickness sensor, the second film-thickness sensor, and the third film-thickness sensor are plotted on the one trajectory.

The data processor 9A superimposes the three trajectories of the film-thickness sensors 7a, 7b, 7e on the wafer W shown in FIG. 5 to form one trajectory, and arrange the measurement points M1, M2, M3 on the one trajectory, as shown in FIG. 6, Distances from the center of the wafer W to the plurality of measurement points M1 are different from distances from the center of the wafer W to the plurality of measurement points M2. Furthermore, the distances from the center of the wafer W to the plurality of measurement points M1 are different distances from the center of the wafer W to the plurality of measurement points M3. Therefore, as shown in FIG. 6, the plurality of measurement points M1 of the first film-thickness sensor 7a, the plurality of measurement points M2 of the second film-thickness sensor 7b, and the plurality of measurement points M3 of the third film-thickness sensor 7c are arranged in order, and do not overlap.

Figure 7:
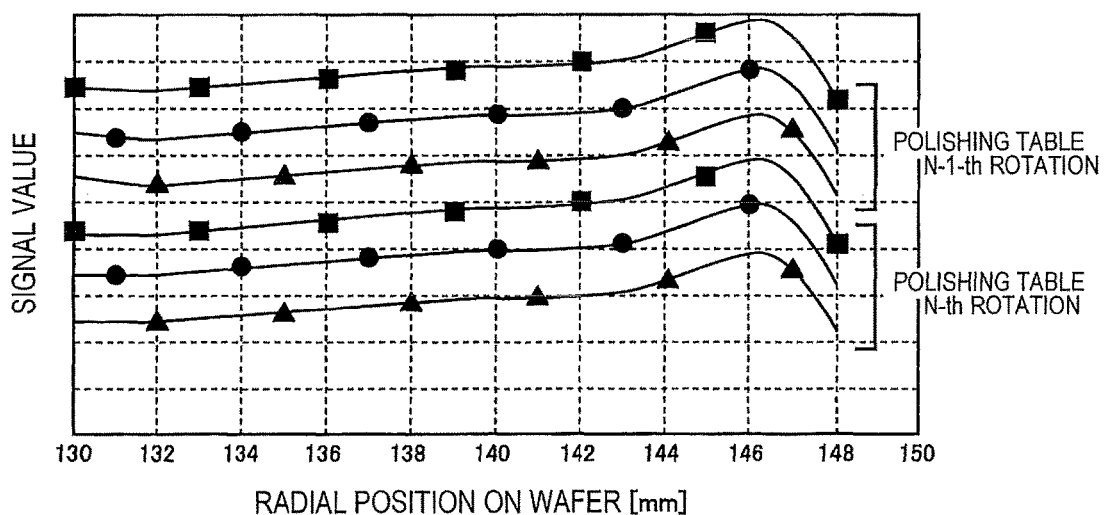
FIG. 7 is a graph showing a change in signal value at each measurement point with rotation of the polishing table.

FIG. 7 is a graph showing changes in signal values at the measurement points M1, M2, and M3 with the rotation of the polishing table 3. The signal value of the first film-thickness sensor 7a is represented by a black square, the signal value of the second film-thickness sensor 7b is represented by a black circle, and the signal value of the third film-thickness sensor 7c is represented by a black triangle. As can be seen from FIG. 7, as the polishing table 3 rotates, the polishing of the wafer W proceeds, and as a result, the signal value indicating the film thickness changes. The first film-thickness sensor 7a, the second film-thickness sensor 7b, and the third film-thickness sensor 7c generate the signal values indicating the film thicknesses at non-overlapping measurement points, i.e., the measurement points M1, M2, and M3 (see FIG. 5) located at different distances from the center of the wafer W.

Figure 8:
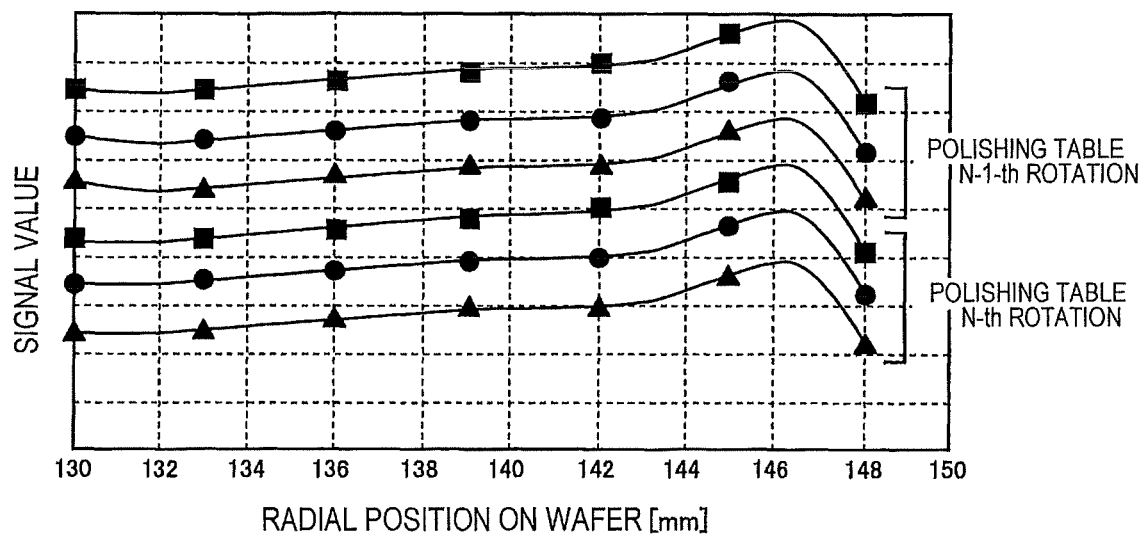
FIG. 8 is a graph showing a change in signal value at each measurement point with rotation of the polishing table according to a conventional polishing method.

FIG. 8 is a graph showing a change in signal value at each measurement point with rotation of the polishing table 3 according to a conventional polishing method. In this conventional example, the first film-thickness sensor 7a, the second film-thickness sensor 7b, and the third film-thickness sensor 7c generate signal values indicating film thicknesses at overlapping measurement points, i.e., at the same measurement points. The number of signal values obtained per rotation of the polishing table 3 is the same as that in the embodiment shown in FIG. 7, but the number of measurement points of the film thickness per one revolution of the polishing table 3 is less than that in the embodiment shown in FIG. 7.

According to the present embodiment shown in FIG. 7, the plurality of (three in this embodiment) film-thickness sensors 7a, 7b, 7c sequentially generate signal values indicating film thicknesses at the measurement point located at different distances from the center of the wafer W, each time the polishing table 3 makes one revolution. Therefore, it is possible to improve a spatial resolution of the film-thickness measurement without changing the film-thickness measuring cycle and without increasing the number of signal values per rotation of the polishing table 3.

Furthermore, in the present embodiment, as described below, interpolation is performed on the signal values of the second film-thickness sensor 7b and the signal values of the third film-thickness sensor 7c to generate interpolated signal values which correspond to signal values generated at the same point in time as the signal value of the first film-thickness sensor 7a.

Figure 9:
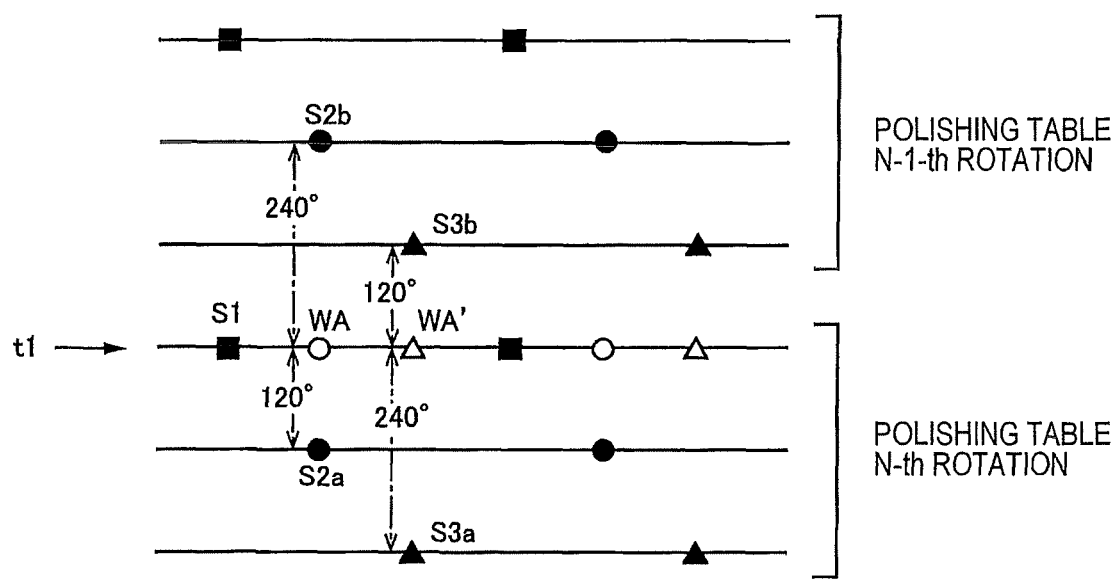
FIG. 9 is an enlarged view showing a part of the graph shown in FIG. 7.

FIG. 9 is an enlarged view showing a part of the graph shown in FIG. 7. During polishing of the wafer W, i.e., when the polishing table 3 is rotating, the data processor 9A obtains a signal value S1 generated bye the first film-thickness sensor 7a at a first point in time t1 in an N-th rotation of the polishing table 3. Further, the data, processor 9A obtains a latest signal value S2a generated by the second film-thickness sensor 7b in the N-th rotation of the polishing table 3, and obtains a previous signal value S2b generated by the second film-thickness sensor 7b in the N−1-th rotation of the polishing table 3. N is a natural number (N≥1). The data processor 9A calculates, from the latest signal value S2a and the previous signal value S2b, an interpolated signal value WA corresponding to a signal value of the second film-thickness sensor 7b at the first point in time t1.

The interpolated signal value is a weighted average of the latest signal value and the previous signal value. More specifically, the interpolated signal value WA is given by the following formula (1).

$$WA = S2a \times ((360-\theta)/360) + S2b \times (\theta/360) \quad (1)$$

The symbol θ represents the angle between two straight lines extending from the center O of the polishing table 3 to the first film-thickness sensor 7a and the second film-thickness sensor 7b. In the present embodiment, the first film-thickness sensor 7a, the second film-thickness sensor 7b, and the third film-thickness sensor 7c are arranged at equal intervals around the center O of the polishing table 3, and therefore the angle θ is 120 degrees. As the angle θ decreases, the second film-thickness sensor 7b approaches the first film-thickness sensor 7a, and the weight of the weighted average increases.

The data processor 9A stores in advance the above formula (1) therein. The data processor 9A further calculates, with use of the formula (1), an interpolated signal value (denoted by white circle in FIG. 9) from a latest signal value and a previous signal value of the second film-thickness sensor 7b indicating film thicknesses at another measurement point.

Similarly, during polishing of the wafer W, the data processor 9A obtains a latest signal value S3a generated by the third film-thickness sensor 7c in the N-th rotation of the polishing table 3, and obtains a previous signal value S3b generated by the third film-thickness sensor 7c in the N−1-th rotation of the polishing table 3e Further, the data processor 9A calculates, from the latest signal value S3a and the previous signal value S3b, an interpolated signal value WA' (denoted by white triangle in FIG. 9) corresponding to a signal value of the third film-thickness sensor 7c at the first point in time t1. The interpolated signal value WA' can be calculated using the above formula (1) with replacement of S2a with S3a and replacement of S2b with S3b. In the present embodiment, an angle θ between two straight lines extending from the center O of the polishing table 3 to the first film-thickness sensor 7a and the third film-thickness sensor 7c is 240 degrees.

The interpolated signal values WA, WA' correspond to signal values generated at the same point in time t1 as the signal value S1 of the first film-thickness sensor 7a. Therefore, the data processor 9A can produce an accurate and precise film-thickness profile using the signal value S1 of the first film-thickness sensor 7a and the interpolated signal values WA, WA'. Based on the signal value S1 of the first film-thickness sensor 7a and the interpolated signal values WA, WA', the data processor 9A determines target pressure values of the pressure chambers C1 to C5 (see FIG. 3) for achieving a target film-thickness profile, and transmits the target pressure values to the operation controller 9B. The target pressure values of the pressure chambers C1 to C4 correspond to target values of the polishing pressure applied from the polishing head 1 to the wafer W. The target pressure value of the pressure chamber C5 corresponds to a target value of the pressing force applied from the retainer ring 32 to the polishing pad 2. The operation controller 9B receives the target pressure values of the pressure chambers C1 to C5 from the data processor 9A, and controls the polishing pressure applied from the polishing head 1 to the wafer W and the pressing force applied from the retainer ring 32 to the polishing pad 2, based on the target pressure values of the pressure chambers C1 to C5. In the case where the signal value S1 and the interpolated signal values WA, WA' indirectly represent film thicknesses of the wafer W, the data processor 9A may convert the signal value S1 and the interpolated signal values WA, WA' into film thickness values, respectively, produce a film-thickness profile from the film thickness values, and determine the target value of the polishing pressure applied from the polishing head 1 to the wafer W and the target value of the pressing force applied from the retainer ring 32 to the polishing pad 2 (i.e., the target pressure values of the pressure chambers C1 to C5) based on the film-thickness values (or the Film-thickness profile).

Further, the data processor 9A can determine a polishing end point of the wafer W based on the signal value S1 of the first film-thickness sensor 7a and the interpolated signal values WA, WA'. For example, the data processor 9A determines a polishing end point which is a point in time when one of the signal value S1 and the interpolated signal values WA, WA' reaches a predetermined target value. When the signal value S1 and the interpolated signal values WA, WA' indirectly indicate film thicknesses, the data processor 9A may convert the signal value S1 of the first film-thickness sensor 7a and the interpolated signal values WA, WA' into film thickness values, respectively, and may determine a polishing end point which is a point in time when one of the film thickness values reaches a predetermined target value. Upon determining the polishing end point, the data processor 9A generates a polishing end point detection signal. The data processor 9A sends the polishing end point detection signal to the operation controller 9B. Upon receipt of the polishing end point detection signal, the operation controller 9B instructs the polishing head 1 to terminate the polishing of the wafer W.

In order to prevent excessive polishing of the wafer W, it is preferable to terminate polishing of the wafer W immediately when any one of the signal value S1 of the first film-thickness sensor 7a (or the film thickness value converted from the signal value S1) and the interpolated signal values WA, WA' (or the film thickness values converted from the interpolated signal values WA, WA') reaches the target value. For example, the data processor 9A may generate a polishing end point detection signal when the signal value S1 of the first film-thickness sensor 7a (or the film thickness value converted from the signal value S) reaches the target value, and may send the polishing end point detection signal to operation controller 9B before calculating the interpolated signal values WA, WA'. Upon receipt of the polishing end point detection signal, the operation controller 9B instructs the polishing head 1 to stop the polishing operation of the wafer W. In another example, the data processor 9A may generate a polishing end point detection signal when the interpolated signal value WA. (or the film thickness value converted from the interpolated signal value WA) reaches the target value, and send the polishing end point detection signal to the operation controller 9B before calculating the interpolated signal value WA'. Upon receipt of the polishing end point detection signal, the operation controller 9B instructs the polishing head 1 to terminate the polishing of the wafer W. According to such operations, excessive polishing of the wafer W can be prevented.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing method comprising:
rotating a first film-thickness sensor and a second film-thickness sensor together with a polishing table, the first film-thickness sensor and the second film-thickness sensor being located at the same distance from a center of the polishing table;
polishing a surface of a substrate by pressing the substrate against a polishing pad on the rotating polishing table;
during polishing of the substrate, each time the polishing table makes one rotation, generating signal values indicating film thicknesses at first measurement points on the surface of the substrate by the first film-thickness sensor, and generating signal values indicating film thicknesses at second measurement points on the surface of the substrate by the second film-thickness sensor, a distance from a center of the substrate to each one of the first measurement points being different from a distance from the center of the substrate to each one of the second measurement points; and
controlling polishing pressure applied from the polishing head to the substrate based on the signal values generated by the first film-thickness sensor and the second film-thickness sensor.

2. The polishing method according to claim 1, further comprising:
obtaining a signal value generated by the first film-thickness sensor at a first point in time in an N-th rotation of the polishing table;
obtaining a latest signal value generated by the second film-thickness sensor during the N-th rotation of the polishing table, and a previous signal value generated by the second film-thickness sensor during an N−1-th rotation of the polishing table; and calculating an interpolated signal value from the latest signal vague and the previous signal value, the interpolated signal value corresponding to a signal value of the second film-thickness sensor at the first point in time, wherein controlling the polishing pressure applied from the polishing head to the substrate based on the signal values generated by the first film-thickness sensor and the second film-thickness sensor comprises controlling polishing pressure applied from the polishing head to the substrate based on the signal value generated by the first film-thickness sensor at the first point in time and the interpolated signal value.

3. The polishing method according to claim 2, wherein the interpolated signal value is a weighted average of the latest signal value and the previous signal value.

4. The polishing method according to claim 3, wherein the interpolated signal given by WA=S2$a$×((360−θ)/360)+S2$b$×(θ/360)

where θ represents an angle between two lines extending from the center of polishing table to the first film-thickness sensor and the second film-thickness sensor, S2$a$ represents the latest signal value, S2$b$ represents the previous signal value, and WA represents the interpolated signal value.

5. The polishing method according to claim 2, further comprising:

producing a film-thickness profile using the signal value generated by the first film-thickness sensor and the interpolated signal value.

6. The polishing method according to claim 2, farther comprising:

determining a polishing end point of the substrate based on the signal value generated by the first film-thickness sensor and the interpolated signal value.

7. The polishing, method according to claim 6, wherein determining the polishing end point comprises terminating polishing of the substrate when one of the signal value generated by the first film-thickness sensor and the interpolated signal value reaches a target value.

8. The polishing method according to claim 6, wherein determining the polishing end point comprises terminating polishing of the substrate when one of film thickness value, converted from the signal value of the first film-thickness sensor, and a film thickness value, converted from the interpolated signal value, reaches a target value.

9. A polishing apparatus comprising:
a polishing table for supporting a polishing pad;
a polishing head configured to press a substrate against the polishing pad to polish the substrate;
a first film-thickness sensor and a second film-thickness sensor arranged in the polishing table and located at the same distance from a center of the polishing table;
a sensor controller configured to transmit trigger signals to the first film-thickness sensor and the second film-thickness sensor each time the polishing table makes one rotation to instruct the first film-thickness sensor to generate signal values indicating film thicknesses at first measurement points on the surface of the substrate and to instruct the second film-thickness sensor to generate signal values indicating film thicknesses at second measurement points on the surface of the substrate, a distance from a center of the substrate to each one of the first measurement points being different from a distance from the center of the substrate to each one of the second measurement points; and
a data processor configured to receive the signal values from the first film-thickness sensor and the second film-thickness sensor and determine a target value of polishing pressure applied from the polishing head to the substrate.

10. The polishing apparatus according to claim 9, further comprising:

a table rotational position detector configured to detect a rotational position of the polishing table, wherein the sensor controller is configured to determine timings for transmitting the trigger signals to the first film-thickness sensor and the second film-thickness sensor based on a signal indicating the rotational position of the polishing table and a rotational speed of the polishing table, and to transmit the trigger signals to the first film-thickness sensor and the second film-thickness sensor with the determined timings to cause the first film-thickness sensor and the second film-thickness sensor to generate the signal values indicating film thicknesses at the measurement paints on the surface of the substrate.

11. The polishing apparatus according to claim 9, further comprising:

an operation controller configured to control the polishing pressure applied from the polishing head to the substrate based on the target value of the polishing pressure.

12. The polishing apparatus according to claim 9, wherein the data processor is configured to:

obtain a signal value generated by the first film-thickness sensor at a first point in time in an N-th rotation of the polishing table;

obtain a latest signal value generated by the second film-thickness sensor during the N-th rotation of the polishing table, and a previous signal value generated by the second film-thickness sensor during an N−1-th rotation of the polishing table;

calculate an interpolated signal value from the latest signal value and the previous signal value, the interpolated signal value corresponding to a signal value of the second film-thickness sensor at the first point in time; and determine the target value of the polishing pressure applied from the polishing head to the substrate based on the signal value generated by the first film-thickness sensor at the first point in time and the interpolated signal value.

13. The polishing apparatus according to claim 12, wherein the data processor stores therein in advance formula expressed as $$WA=S2a\times((360-\theta)/360)+S2b\times(\theta/360)$$

where θ represents an angle between two lines extending from the center of the polishing table to the first film-thickness sensor and the second film-thickness sensor, S2$a$ represents the latest signal value, S2$b$ represents the previous signal value, and WA represents the interpolated signal value.

14. The polishing apparatus according to claim 12, wherein data processor is configured to produce a film-thickness profile using the signal value generated by the first film-thickness sensor and the interpolated signal value.

15. The polishing apparatus according to claim 12, wherein the data processor is configured to determine a polishing end point of the substrate based on the signal value generated by the first film-thickness sensor and the interpolated signal value.

\* \* \* \* \*